US010429720B2

(12) United States Patent
Saito et al.

(10) Patent No.: US 10,429,720 B2
(45) Date of Patent: Oct. 1, 2019

(54) WAVELENGTH CONVERSION-TYPE SPATIAL LIGHT MODULATION DEVICE

(71) Applicant: HAMAMATSU PHOTONICS K.K., Hamamatsu-shi, Shizuoka (JP)

(72) Inventors: Hiroshi Saito, Hamamatsu (JP); Masatoshi Fujimoto, Hamamatsu (JP); Shingo Oishi, Hamamatsu (JP); Kenshi Fukumitsu, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 951 days.

(21) Appl. No.: 14/428,854

(22) PCT Filed: Sep. 3, 2013

(86) PCT No.: PCT/JP2013/073670
§ 371 (c)(1),
(2) Date: Mar. 17, 2015

(87) PCT Pub. No.: WO2014/045865
PCT Pub. Date: Mar. 27, 2014

(65) Prior Publication Data
US 2015/0219980 A1    Aug. 6, 2015

(30) Foreign Application Priority Data

Sep. 19, 2012 (JP) ................................. 2012-205773

(51) Int. Cl.
*G02F 1/37* (2006.01)
*G02B 5/30* (2006.01)
(Continued)

(52) U.S. Cl.
CPC ............. *G02F 1/37* (2013.01); *G02B 5/3091* (2013.01); *G02F 1/1337* (2013.01);
(Continued)

(58) Field of Classification Search
CPC ........ G02F 2203/12; G02F 2/004; G02F 2/00; G02F 1/35; G02F 1/37; G02F 2002/006;
(Continued)

(56) References Cited

U.S. PATENT DOCUMENTS 5,072,314 A * 12/1991 Chang .................... G02B 27/46
359/489.07
5,552,926 A *  9/1996 Owa ......................... G02F 1/37
359/326

(Continued)

FOREIGN PATENT DOCUMENTS

| JP | H9-162104 | 6/1997 |
| JP | 2009-294509 A | 12/2009 |
| JP | 2011-031284 | 2/2011 |

OTHER PUBLICATIONS

M. Hacker et al., "Micromirror SLM for femtosecond pulse shaping in the ultraviolet", Applied Physics B vol. 76, 2003, p. 711-p. 714.
(Continued)

*Primary Examiner* — Jessica M Merlin
(74) *Attorney, Agent, or Firm* — Drinker Biddle & Reath LLP

(57) ABSTRACT

The device includes a spatial light modulation section having a phase modulation plane to which laser light L1 in a wavelength region longer than an ultraviolet region is input, and on which a phase of the laser light L1 is modulated at each of a plurality of two-dimensionally arrayed regions, to generate modulated laser light L2, a wavelength conversion section having a light incident plane which receives the modulated laser light L2 output from the spatial light modulation section, and converting a wavelength of the modulated laser light L2 into a wavelength in the ultraviolet region, and an image transfer optical system coupling the phase modulation plane of the spatial light modulation section and the light incident plane of the wavelength (Continued)

conversion section, so as to be optically conjugate systems to each other.

10 Claims, 17 Drawing Sheets

(51) Int. Cl.
G02F 1/1337 (2006.01)
G02F 1/1362 (2006.01)
G02F 1/29 (2006.01)
G03F 7/20 (2006.01)
G02F 1/1335 (2006.01)
G02F 1/35 (2006.01)

(52) U.S. Cl.
CPC ........ *G02F 1/136277* (2013.01); *G02F 1/292* (2013.01); *G03F 7/70291* (2013.01); *G02F 1/133553* (2013.01); *G02F 1/3534* (2013.01); *G02F 2203/18* (2013.01)

(58) Field of Classification Search
CPC . G02F 1/292; G02F 1/353; G03H 2001/0224; G03F 7/70291
See application file for complete search history.

(56) References Cited

U.S. PATENT DOCUMENTS

| | | | | |
|---|---|---|---|---|
| 6,128,030 | A * | 10/2000 | Kikuchi | G03F 7/70091 250/492.2 |
| 2002/0171912 | A1* | 11/2002 | Masuda | G02F 1/3532 359/326 |
| 2004/0233489 | A1 | 11/2004 | Lee | |
| 2005/0134948 | A1* | 6/2005 | Waldman | G03H 1/16 359/3 |
| 2006/0290777 | A1 | 12/2006 | Iwamoto et al. | |
| 2009/0303597 | A1 | 12/2009 | Miyawaki et al. | |
| 2011/0267679 | A1* | 11/2011 | Ito | G02B 5/285 359/291 |
| 2012/0013877 | A1* | 1/2012 | Tanaka | G02B 26/008 355/67 |
| 2012/0120475 | A1 | 5/2012 | Sakurai | |
| 2012/0305811 | A1* | 12/2012 | Wakabayashi | H05G 2/008 250/504 R |
| 2014/0233008 | A1* | 8/2014 | Tanitsu | G03F 7/70116 355/71 |
| 2015/0323786 | A1* | 11/2015 | Kita | G03F 7/70116 430/325 |

OTHER PUBLICATIONS

K. Hazu et al., "Spatial light modulator with an over-two-octave bandwidth from ultraviolet to near infrared", Optics Letters vol. 32, No. 22, 2007, p. 3318-p. 3320.

A. Holle et al., "Optimizing UV laser focus profiles for improved MALDI performance", Journal of Mass Spectrometry vol. 41, 2006, p. 705-p. 716.

P. Nuernberger et al., "Generation of shaped ultraviolet pulses at the third harmonic of titanium-sapphire femtosecond laser radiation", Applied Physics B vol. 88, 2007, p. 519-p. 526.

T. Tanigawa et al., "Spatial light modulator of 648 pixels with liquid crystal transparent from ultraviolet to near-infrared and its chirp compensation application", Optics Letters vol. 34 No. 11, 2009, p. 1696-p. 1698.

English-language translation of International Preliminary Report on Patentability (IPRP) dated Apr. 2, 2015 that issued in WO Patent Application No. PCT/JP2013/073670.

* cited by examiner (a)

(b)

WAVELENGTH CONVERSION-TYPE SPATIAL LIGHT MODULATION DEVICE

TECHNICAL FIELD

The present invention relates to a wavelength conversion type spatial light modulation device.

BACKGROUND ART

In Non-Patent Document 1, a technology of performing phase modulation of ultraviolet light (wavelength of 400 nm) on a Fourier plane by use of a MEMS (Micro Electro Mechanical Systems) mirror is described. This MEMS mirror used in Non-Patent Document 1 is capable of spatially phase-modulating light contained in a wavelength range of 200 nm or more and 900 nm or less.

Further, in Non-Patent Document 2, a technology of performing phase modulation of broadband light on a Fourier plane by use of a liquid crystal device which is capable of allowing transmission of light in a wavelength range including an ultraviolet region is described. This liquid crystal device used in Non-Patent Document 2 is capable of spatially phase-modulating light contained in a wavelength range of 260 nm or more and 1100 nm or less. In addition, the evaluation result of the liquid crystal itself used in Non-Patent Document 2 is described in Non-Patent Document 3.

Further, in Non-Patent Document 4, a technology of spatially phase-modulating light with a wavelength band of 350 nm is described. This phase modulation device used in Non-Patent Document 4 is thought of as a device having a fixed modulation pattern such as a diffractive optics element (DOE: Diffractive Optics Elements).

Further, in Non-Patent Document 5, a technology of performing wavelength conversion after phase modulation on a Fourier plane with the aim of control of a pulse waveform of ultraviolet laser light is described.

CITATION LIST

Non Patent Literature

Non-Patent Document 1: M. Hacker et al., "Micromirror SLM for femtosecond pulse shaping in the ultraviolet," Applied Physics B, Vol. 76, pp. 711-714 (2003)
Non-Patent Document 2: T. Tanigawa et al., "Spatial light modulator of 648 pixels with liquid crystal transparent from ultraviolet to near-infrared and its chirp compensation application," Optics Letters, Vol. 34, No. 11, pp. 1696-1698 (2009)
Non-Patent Document 3: K. Hazu et al., "Special light modulator with an over-two-octave bandwidth from ultraviolet to near infrared," Optics Letters, Vol. 32, pp. 3318-3320 (2007)
Non-Patent Document 4: A. Holle et al., "Optimizing UV laser focus profiles for improved MALDI performance," Journal of Mass Spectrometry, Vol. 41, pp. 705-716 (2006)
Non-Patent Document 5: P. Nuernberger et al., "Generation of shaped ultraviolet pulses at the third harmonic of titanium-sapphire femtosecond laser radiation," Applied Physics B, Vol. 88, pp. 519-526 (2007)

SUMMARY OF INVENTION

Technical Problem

In recent years, in the field of laser processing, laser light has been spatially phase-modulated by use of a spatial light modulator. This is because, by using a spatial light modulator, it is possible to shape laser light into an arbitrary pattern, which makes it possible to achieve various types of characteristic processing.

Further, in recent years, in the field of laser processing, processing by ultraviolet laser light has been tried. As compared with processing by using near-infrared light or visible light, processing by ultraviolet laser light has many advantages that laser light is easily absorbed into various materials, fine processing is possible because it is possible to reduce a spot diameter, and thermal influence onto a processing object is reduced. Therefore, processing by ultraviolet laser light broadens a range in application of materials to be processed, and is capable of realizing high-quality and fine processing. Further, ultraviolet laser light is favorably used for processing by a chemical action such as exposure in photolithography or irradiation onto ultraviolet curable resin.

However, because a photon energy of ultraviolet laser light is higher than those of near-infrared light or visible light, when ultraviolet laser light is spatially phase-modulated by use of a spatial light modulator, the phase modulation may exert influence on the operation of the spatial light modulator in some cases. For example, in a case of an LCOS (Liquid crystal on silicon) type spatial light modulator, because ultraviolet laser light transmits through a liquid crystal layer and alignment films provided on the both sides thereof, thereby gradually deteriorating those, it is difficult to stably perform a modulation operation.

The present invention has been achieved in consideration of the above-described problem, and an object thereof is to provide a wavelength conversion type spatial light modulation device which is capable of outputting ultraviolet laser light which is spatially phase-modulated, and reduces influence onto its spatial light modulation section.

Solution to Problem

In order to solve the above-described problem, a wavelength conversion type spatial light modulation device according to the present invention includes a spatial light modulation section having a phase modulation plane to which laser light in a wavelength region longer than an ultraviolet region is input, and on which a phase of the laser light is modulated at each of a plurality of two-dimensionally arrayed regions, to generate modulated laser light, a wavelength conversion section having a light incident plane which receives the modulated laser light output from the spatial light modulation section, and converting a wavelength of the modulated laser light into a wavelength in the ultraviolet region, and an image transfer optical system coupling the phase modulation plane of the spatial light modulation section and the light incident plane of the wavelength conversion section, so as to be optically conjugate systems to each other.

This wavelength conversion type spatial light modulation device includes the spatial light modulation section and the wavelength conversion section. The spatial light modulation section allows laser light in a wavelength region longer than an ultraviolet region (for example, a visible region) to be input, and spatially phase-modulates this laser light. Accordingly, as compared with the case where ultraviolet laser light is input, influence on the operation of the spatial light modulation section is drastically reduced. Further, the wavelength conversion section converts a wavelength of the modulated laser light output from the spatial light modulation section into a wavelength in an ultraviolet region.

Thereby, it is possible to favorably output ultraviolet laser light which is spatially phase-modulated.

Further, usually, when spatially inhomogeneous phase modulation is performed onto laser light, the laser light shows propagation characteristics with respective modulation points serving as point light sources. Accordingly, a phase distribution in the laser light after phase modulation gradually changes according to the propagation of the laser light. In consideration of this problem, in the above-described wavelength conversion type spatial light modulation device, the phase modulation plane of the spatial light modulation section and the light incident plane of the wavelength conversion section are coupled so as to be optically conjugate systems to each other by the image transfer optical system. Thereby, it is possible to transfer a phase distribution provided to the laser light on the phase modulation plane of the spatial light modulation section, onto the light incident plane (that is, the wavelength conversion plane) of the wavelength conversion section, so that it is possible to perform wavelength conversion in a state in which a desired phase distribution is provided to the laser light. Accordingly, in accordance with the above-described wavelength conversion type spatial light modulation device, it is possible to favorably output ultraviolet laser light onto which a desired phase modulation is performed.

Advantageous Effects of Invention

In accordance with the wavelength conversion type spatial light modulation device of the present invention, it is possible to output ultraviolet laser light which is spatially phase-modulated, and it is possible to reduce the influence on the spatial light modulation section.

DESCRIPTION OF EMBODIMENTS

Hereinafter, embodiments of a wavelength conversion type spatial light modulation device according to the present invention will be described in detail with reference to the accompanying drawings. In addition, in the description of the drawings, the same components are denoted by the same reference symbols, and overlapping descriptions thereof will be omitted.

First Embodiment

Figure 1:
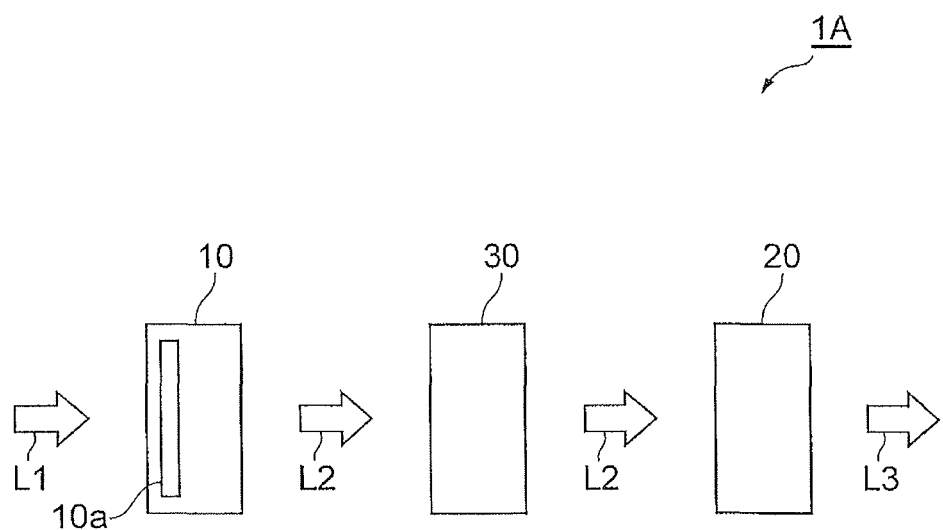
FIG. 1 is a diagram schematically showing a configuration of a wavelength conversion type spatial light modulation device according to a first embodiment.

FIG. 1 is a diagram schematically showing a configuration of a wavelength conversion type spatial light modulation device (hereinafter called a light modulation device) according to a first embodiment of the present invention. A light modulation device 1A according to the present embodiment includes a spatial light modulation section 10, a wavelength conversion section 20, and an image transfer optical system 30.

The spatial light modulation section 10 has a phase modulation plane 10a on which a phase of input light at each of a plurality of regions which are two-dimensionally arrayed is modulated. The spatial light modulation section 10 according to the present embodiment includes, for example, an LCOS type spatial light modulator. The spatial light modulation section 10 allows laser light L1 in a wavelength region longer than an ultraviolet region (for example, a visible region or an infrared region. Specifically, a wavelength of 400 nm or more) to be input to the phase modulation plane 10a, modulates a phase of the laser light L1 at each of the plurality of regions described above, and performs predetermined phase modulation onto the respective points in a cross-section perpendicular to an optical axis of the laser light L1 (hereinafter called a beam cross-section), and thereafter outputs laser light L2 after phase modulation (hereinafter called modulated laser light).

The wavelength conversion section 20 has a light incident plane which receives the modulated laser light L2 output from the spatial light modulation section 10, and converts a wavelength of the modulated laser light L2 into a wavelength in an ultraviolet region (for example, 200 nm to 400 nm). The wavelength conversion section 20 outputs ultraviolet laser light L3 after wavelength conversion, to the outside of the light modulation device 1A.

As the wavelength conversion section 20, a section having the characteristics that the light wave phase information before wavelength conversion has a given functional relationship with the light wave phase information after wavelength conversion is used. Therefore, the wavelength conversion section 20 includes, for example, a nonlinear optical crystal, and generates a harmonic (a second harmonic or the like) of the modulated laser light L2, thereby converting the modulated laser light L2 into the ultraviolet laser light L3. For example, in the case where the nonlinear optical crystal generates a second harmonic, because output light proportional to the square of an electric field at each point of the beam cross-section of the input modulated laser light L2 is generated, it is possible to obtain the ultraviolet laser light L3 having a phase modulation amount at each point which is double the phase modulation amount at each point of the beam cross-section of the modulated laser light L2. In addition, a method of generating a harmonic is just an example, and the configuration of the wavelength conversion section 20 is not limited thereto.

Here, usually, when spatially inhomogeneous phase modulation is performed onto laser light, the laser light shows propagation characteristics with respective modulation points serving as point light sources. Accordingly, a phase distribution in the modulated laser light L2 gradually changes according to the propagation of the modulated laser light L2. Therefore, in the present embodiment, the image transfer optical system 30 transfers an intensity and a phase distribution of the beam cross-section of the modulated laser light L2 on the phase modulation plane 10a onto an intensity and a phase distribution of a beam cross-section on the light incident plane (the wavelength conversion plane) of the wavelength conversion section 20.

That is, the image transfer optical system 30 of the present embodiment is an optical system disposed between the spatial light modulation section 10 and the wavelength conversion section 20, and couples the phase modulation plane 10a of the spatial light modulation section 10 and the light incident plane of the wavelength conversion section 20, so as to be optically conjugate systems to each other. The image transfer optical system 30 includes one or a plurality of lenses. As a configuration of the image transfer optical system 30, a 4f optical system having the feature of making parallel light correspond to parallel light is preferable, or it may be a configuration in which a plurality of 4f optical systems are coupled, however, a configuration is not limited thereto. For example, the image transfer optical system 30 may be an optical system in which the phase modulation plane 10a and the light incident plane of the wavelength conversion section 20 are conjugated by a single lens. Further, the relationship between the imaging planes in front and back of the image transfer optical system 30 may be any one of magnification, equal, and reduction.

Due to such an effect of the image transfer optical system 30, it is possible to transfer a phase distribution of the modulated laser light L2 provided on the phase modulation plane 10a of the spatial light modulation section 10, onto the light incident plane (the wavelength conversion plane) of the wavelength conversion section 20, so that it is possible to perform wavelength conversion in a state in which the modulated laser light L2 keeps a desired phase distribution. In other words, a phase modulation amount at each point of the modulated laser light L2 on the wavelength conversion plane is the same level as a phase modulation amount at a conjugate point of the phase modulation plane 10a of the spatial light modulation section 10. Thereby, it is possible to favorably control a phase modulation amount at each point of a beam cross-section in wavelength conversion.

In accordance with the light modulation device 1A according to the present embodiment, with the above-described configuration, it is possible to favorably control a spatial phase modulation amount at each point of a beam cross-section of the ultraviolet laser light L3 in the wavelength conversion section 20, by phase modulation in the spatial light modulation section 10, and therefore, it is possible to favorably output the ultraviolet laser light L3 in which a desired phase modulation is performed onto each point of the beam cross-section.

Figure 2:
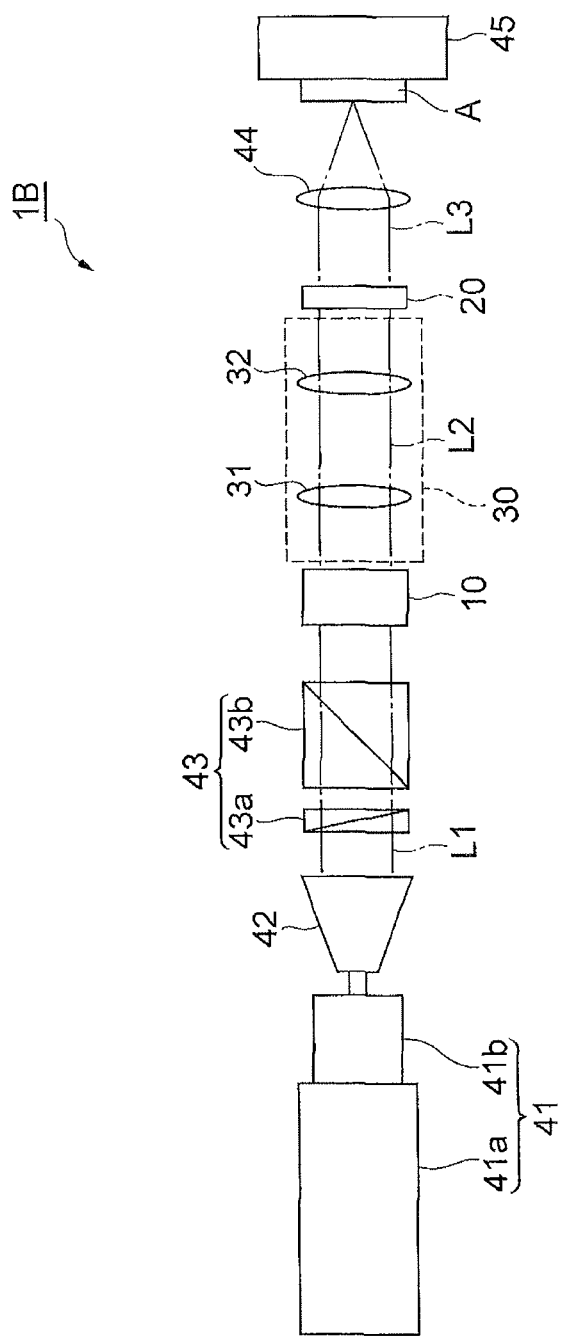
FIG. 2 is a diagram showing a light modulation device as a specific example of the above-described light modulation device.

FIG. 2 is a diagram showing a light modulation device 1B as a specific example of the above-described light modulation device 1A. The light modulation device 1B shown in FIG. 2 includes, in addition to the spatial light modulation section 10, the wavelength conversion section 20, and the image transfer optical system 30 described above, a light source 41, a beam expander 42, an attenuator 43, a condensing lens 44, and a processing stage 45.

The light source 41 outputs, for example, pulsed laser light with a wavelength of 515 nm, a pulse width of 1.0 ps, and a repetition frequency of 100 Hz as the laser light L1. The light source 41 preferably includes, for example, an ultra-short pulsed laser light source 41a and a second harmonic (SHG) conversion unit 41b. In the case where the light source 41 outputs light with a wavelength of 515 nm as the laser light L1, the ultra-short pulsed laser light source 41a outputs light with a wavelength of 1030 nm. The SHG conversion unit 41b generates a second harmonic of this light, that is light with a wavelength of 515 nm. The laser light L1 output from the light source 41 is adjusted to have the optimum beam profile and light intensity by the beam expander 42 and the attenuator 43, and is thereafter incident into the spatial light modulation section 10. In addition, it is preferable that the attenuator 43 includes, for example, a wave plate 43a and a polarization beam splitter 43b.

The image transfer optical system 30 is composed of a relay optical system including two lenses 31 and 32. As described above, the image transfer optical system 30 couples the phase modulation plane of the spatial light modulation section 10 and the light incident plane of the wavelength conversion section 20, so as to be optically conjugate systems to each other.

The wavelength conversion section 20 is a nonlinear optical crystal such as a BBO crystal, an LBO crystal, or a CLBO crystal, for example, which is suitable for generating a harmonic in an ultraviolet region. In this example, because the ultra-short pulsed laser light source 41a is used as the light source 41, even if a thickness of the nonlinear optical crystal is set to be less than or equal to a length at which the conjugate relationship by the image transfer optical system 30 is sufficiently kept, it is possible to obtain a sufficient conversion efficiency. In addition, in the case where a light source (continuum light source or the like) other than the ultra-short pulsed laser light source 41a is used as the light source 41, a long nonlinear optical crystal is used as the wavelength conversion section 20 in order to increase the wavelength conversion efficiency. Accordingly, the image transfer optical system 30 preferably has a conjugate system with a long depth of focus in consideration of a width in the optical axis direction of the nonlinear optical crystal.

In this light modulation device 1B, the phase modulation plane of the spatial light modulation section 10 and the wavelength conversion plane (the nonlinear optical crystal plane) of the wavelength conversion section 20 have a conjugate relationship with each other by the relay optical system of the image transfer optical system 30. Thereby, a modulation wave front on the phase modulation plane is transferred to the nonlinear optical crystal plane. Then, the transferred light (the modulated laser light L2) is converted into light with a wavelength of ½ in the nonlinear optical crystal, to be emitted as the ultraviolet laser light L3. At this time, a phase modulation amount at the wave front of the emitted light is double the phase modulation amount provided to the spatial light modulation section 10. Thereby, the wave front modulation of the ultraviolet laser light L3 (wavelength of 258 nm) is favorably realized.

In addition, as shown in FIG. 2, the modulated ultraviolet laser light L3 is guided to a processing portion of a processing object A via a predetermined optical system (for example, a 4f optical system) from the nonlinear optical crystal plane of the wavelength conversion section 20, thereby it is possible to perform processing onto the processing object A with a desired pattern. In addition, in this example, the condensing lens 44 is exemplified as the above-described predetermined optical system, however, a predetermined optical system is not limited thereto.

Figure 3:
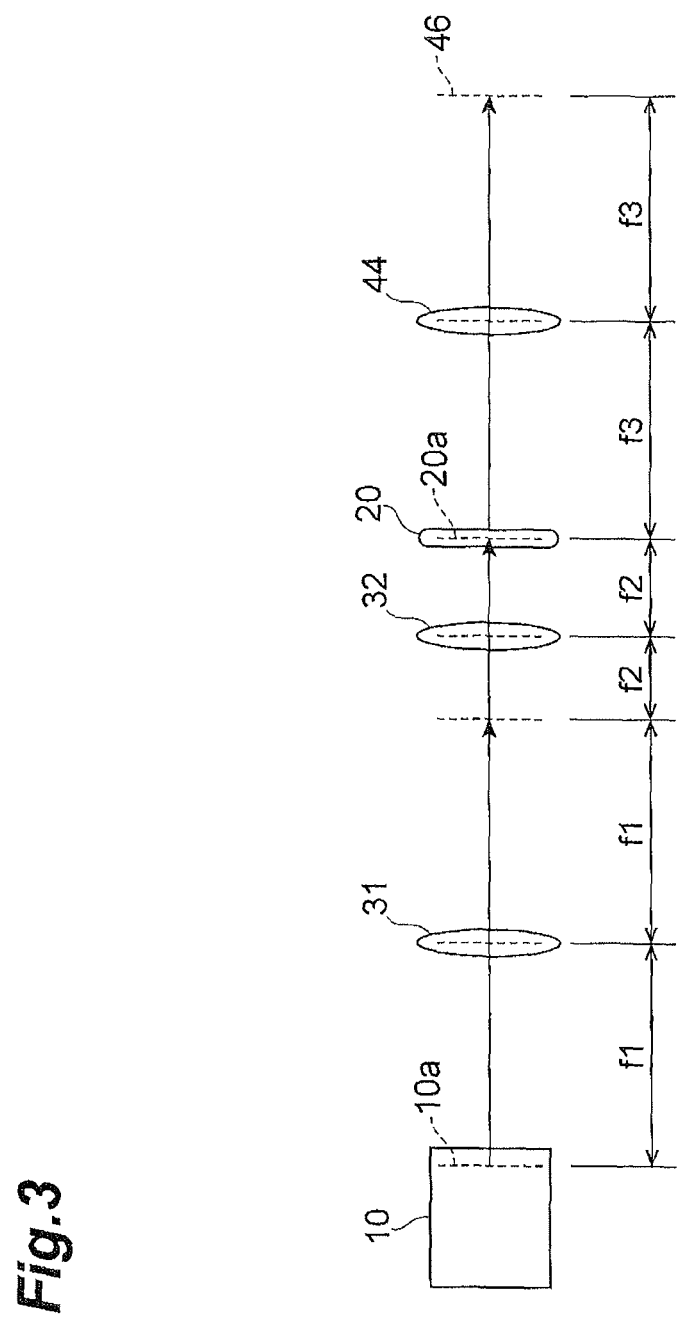
FIG. 3 is a diagram showing a specific example of an image transfer optical system and the above-described predetermined optical system.

FIG. 3 is a diagram showing a specific example of the image transfer optical system 30 and the above-described predetermined optical system. In the light modulation device 1B shown in FIG. 2, in order to precisely transfer a phase distribution provided by the phase modulation plane 10a of the spatial light modulation section 10, to the wavelength conversion plane 20a of the wavelength conversion section 20, the phase modulation plane 10a and the wavelength conversion plane 20a preferably have a Fourier conjugate relationship. For example, as shown in FIG. 3, it is preferable that a distance between the phase modulation plane 10a and the lens 31 is made equal to a focal length f1 (for example, 250 mm) of the lens 31, a distance between the lens 31 and the lens 32 is made equal to a sum of the focal length f1 and a focal length f2 (for example, 100 mm) of the lens 32, and a distance between the lens 32 and the wavelength conversion plane 20a is made equal to the focal length f2. Further, it is preferable that a distance between the wavelength conversion plane 20a and the lens 44, and a distance between the lens 44 and an imaging plane 46 (the surface of the processing object) are respectively made equal to a focal length f3 (for example, 200 mm) of the lens 44.

In accordance with the image transfer optical system 30, the phase modulation plane 10a and the wavelength conversion plane 20a are made to correspond to each other as a reduction optical system, and the modulated laser light L2 generated on the phase modulation plane 10a is imaged on the wavelength conversion plane 20a serving as a Fourier conjugate plane. In addition, at the time of actually performing fine processing, it is preferable to transfer a phase distribution on the phase modulation plane 10a to a pupil plane of the objective lens 44, to obtain a pattern in an appropriate size.

Figure 4:
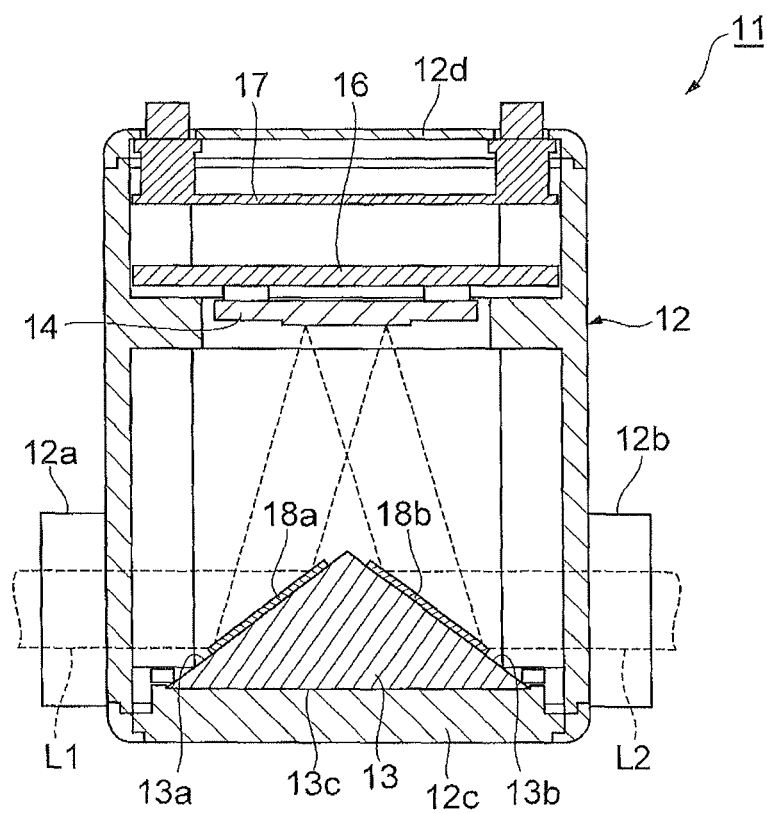
FIG. 4 is a sectional side view showing an SLM module as an example of a spatial light modulation section.

FIG. 4 is a sectional side view showing an SLM (Spatial Light Modulator) module 11 as an example of the spatial light modulation section 10. This SLM module 11 includes a housing 12, and a prism 13 and a reflection type SLM 14 which are housed inside the housing 12. The housing 12 has a substantially cuboid shaped appearance, and an opening 12a is provided in one of a pair of side walls thereof, and an opening 12b is provided in the other side wall. The laser light L1 is incident into the opening 12a from the light source 41 shown in FIG. 2.

The prism 13 shows a tetrahedron whose one cross-section is a triangle shape, and includes a first surface 13a including one side of the three sides of the triangle shape, a second surface 13b including another side, and a third surface 13c including the other side. A dielectric multilayer mirror 18a which reflects the laser light L1 is formed on the first surface 13a, and a dielectric multilayer mirror 18b which reflects the laser light L1 in the same way is formed on the second surface 13b. The prism 13 is placed on a bottom plate 12c of the housing 12 such that its thickness direction is perpendicular to an axis line connecting the opening 12a and the opening 12b. Then, the first surface 13a of the prism 13 is disposed toward the opening 12a of the housing 12, and the second surface 13b is disposed toward the opening 12b. The third surface 13c of the prism 13 is disposed on the bottom plate 12c of the housing 12.

The reflection type SLM 14 is disposed above the prism 13 inside the housing 12. The reflection type SLM 14 receives the laser light L1 reflected by the dielectric multilayer mirror 18a from the diagonally front, and phase-modulates the laser light L1 at each of a plurality of two-dimensionally arrayed regions (pixels) while reflecting the laser light L1, thereby generating the modulated laser light L2. In addition, the reflection type SLM 14 is supported by a tilt and shift mechanism 16. The tilt and shift mechanism 16 is fixed to the housing 12 in order to adjust an angle of the reflection type SLM 14, and suspends the reflection type SLM 14. A circuit substrate 17 for controlling the reflection type SLM 14 is disposed between the tilt and shift mechanism 16 and a top plate 12d of the housing 12.

Figure 5:
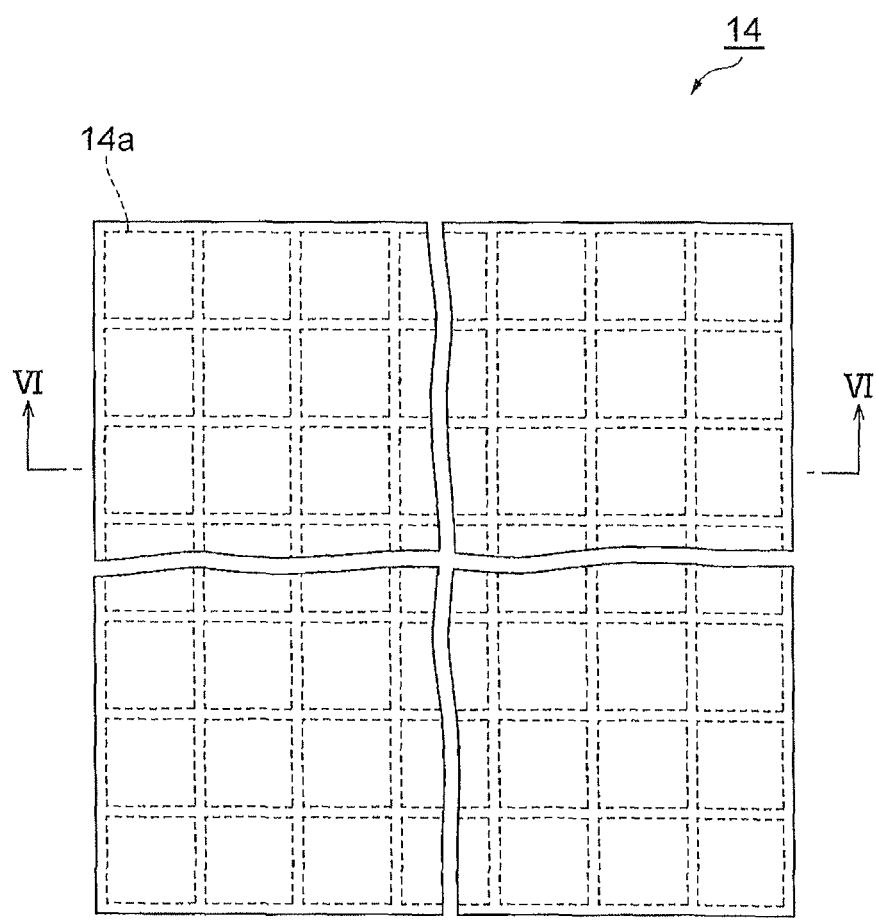
FIG. 5 is a plan view of a reflection type SLM.
Figure 6:
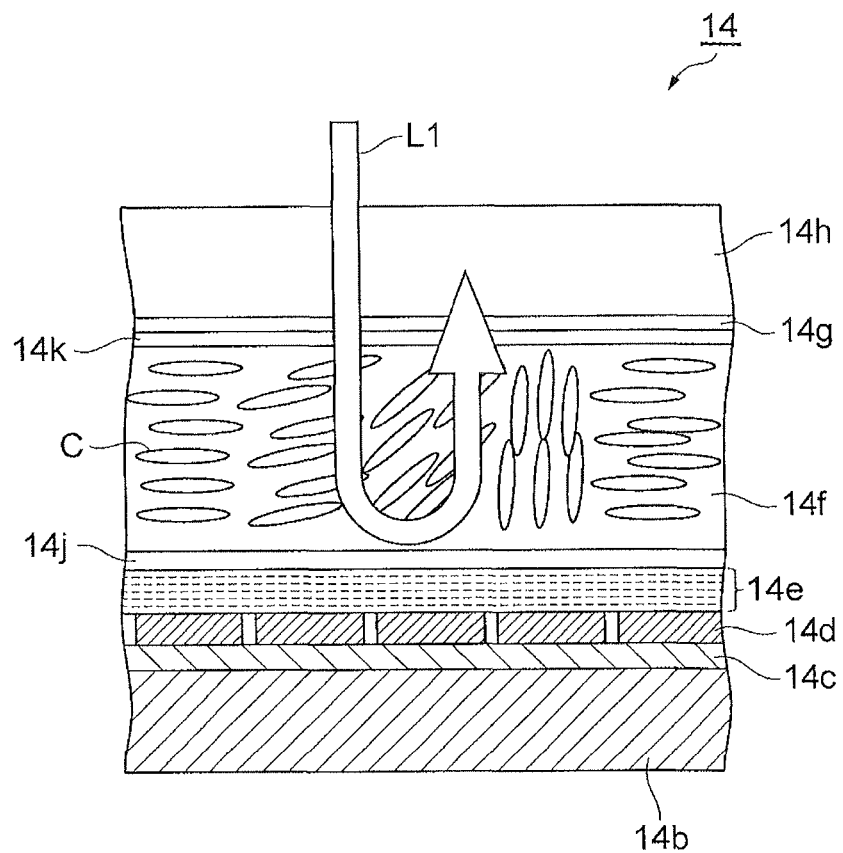
FIG. 6 is a sectional side view along the line VI to VI of the reflection type SLM shown in FIG. 5.

FIG. 5 and FIG. 6 are diagrams showing a configuration example of the reflection type SLM 14. FIG. 5 is a plan view of the reflection type SLM 14. Further, FIG. 6 is a sectional side view along the line VI to VI of the reflection type SLM 14 shown in FIG. 5. The reflection type SLM 14 of the present embodiment includes a plurality of two-dimensionally arrayed pixel regions 14a as shown in FIG. 5. Further, with reference to FIG. 6, the reflection type SLM 14 includes a silicon substrate 14b, a driving circuit layer 14c, a plurality of pixel electrodes 14d, a dielectric multilayer film 14e, a liquid crystal layer 14f, a transparent conductive film 14g, and a transparent substrate 14h.

The transparent substrate 14h mainly contains a light transmissive material such as glass, and allows the incident laser light L to transmit to the inside of the reflection type SLM 14. The transparent conductive film 14g is formed on the rear surface of the transparent substrate 14h, and is mainly composed of an electrically-conductive material (for example ITO) allowing the laser light L1 to transmit therethrough. The plurality of pixel electrodes 14d are two-dimensionally arrayed according to the array of the plurality of pixel regions 14a shown in FIG. 5, and are arrayed on the silicon substrate 14b along the transparent conductive film 14g. The respective pixel electrodes 14d are made of a metallic material such as aluminum, and their surfaces are processed to be flat and smooth. The plurality of pixel electrodes 14d are driven by an active matrix circuit provided in the driving circuit layer 14c. The active matrix circuit controls an applied voltage to each of the respective pixel electrodes 14d according to an optical image of the modulated laser light L2 to be output from the reflection type SLM 14.

The liquid crystal layer 14f is disposed between the plurality of pixel electrodes 14d and the transparent conductive film 14g, and alignment films 14j and 14k are respectively disposed on the both sides thereof (between the liquid crystal layer 14f and the pixel electrodes 14d, and between the liquid crystal layer 14f and the transparent conductive film 14g). The liquid crystal layer 14f modulates a phase of the laser light L1 according to an electric field formed by each of the respective pixel electrodes 14d and the transparent conductive film 14g. That is, when a voltage is applied to a certain pixel electrode 14d by the active matrix circuit, an electric field is formed between the transparent conductive film 14g and the pixel electrode 14d. This electric field is applied, at a ratio corresponding to the respective thicknesses, respectively to the dielectric multilayer film 14e and the liquid crystal layer 14f. Then, the alignment directions of the liquid crystal molecules C change according to a level of the electric field applied to the liquid crystal layer 14f.

When the laser light L1 transmits through the transparent substrate 14h and the transparent conductive film 14g, to be incident into the liquid crystal layer 14f, this laser light L1 is modulated by the liquid crystal molecules C during the laser light transmitting through the liquid crystal layer 14f, and reflected by the dielectric multilayer film 14e, and is thereafter modulated again by the liquid crystal layer 14f, to be taken out. The dielectric multilayer film 14e is disposed between the plurality of pixel electrodes 14d and the liquid crystal layer 14f, and reflects the laser light L1 at high reflectance in cooperation with the light reflection action that the surfaces of the pixel electrodes 14d have.

The effects obtained by the light modulation devices 1A and 1B according to the present embodiment having the above-described configuration will be described. These light modulation devices 1A and 1B include the spatial light modulation section 10 and the wavelength conversion section 20. The spatial light modulation section 10 allows laser light L1 in a wavelength region longer than an ultraviolet region to be input, and spatially phase-modulates this laser light L1. Accordingly, as compared with the case where ultraviolet laser light is input, influence on the operation of the spatial light modulation section 10 is drastically reduced. Further, the wavelength conversion section 20 converts a wavelength of the modulated laser light L2 output from the spatial light modulation section 10 into a wavelength in an ultraviolet region. Thereby, it is possible to favorably output the ultraviolet laser light L3 which is spatially phase-modulated.

Further, in these light modulation devices 1A and 1B, the phase modulation plane 10a of the spatial light modulation section 10 and the wavelength conversion plane 20a of the wavelength conversion section 20 are coupled so as to be optically conjugate systems to each other by the image transfer optical system 30. Thereby, it is possible to transfer a phase distribution provided to the laser light L1 on the phase modulation plane 10a of the spatial light modulation section 10, onto the wavelength conversion plane 20a of the wavelength conversion section 20, so that it is possible to perform wavelength conversion in a state in which a desired phase distribution is provided to the modulated laser light L2. Accordingly, in accordance with the light modulation devices 1A and 1B according to the present embodiment, it is possible to favorably output the ultraviolet laser light L3 onto which a desired phase modulation is performed.

Further, as in the present embodiment, the spatial light modulation section 10 may have the liquid crystal layer 14f for modulating a phase of the laser light L1 according to a level of an applied electric field, the alignment films 14j and 14k which are disposed on the both sides of the liquid crystal layer 14f, and the plurality of electrodes 14d which are provided respectively for the plurality of regions, and apply a voltage for generating the applied electric field to the liquid crystal layer 14f. When ultraviolet laser light transmits through these liquid crystal layer 14f and alignment films 14j and 14k of the spatial light modulation section 10, the liquid crystal layer 14f and the alignment films 14j and 14k are gradually deteriorated. In accordance with the light modulation devices 1A and 1B according to the present embodiment, because the laser light L1 in a wavelength region longer than an ultraviolet region is input to the spatial light modulation section 10, while reducing the influence on the liquid crystal layer 14f and the alignment films 14j and 14k, it is possible to favorably output the ultraviolet laser light L3 which is spatially phase-modulated.

Further, as in the present embodiment, the wavelength conversion section 20 preferably includes a nonlinear optical crystal. Thereby, it is possible to favorably convert a wavelength of the modulated laser light L2 in a wavelength region longer than an ultraviolet region into a wavelength in an ultraviolet region.

Further, as in the present embodiment, the image transfer optical system 30 preferably includes a 4f optical system. Thereby, it is possible to favorably transfer a phase distribution provided to the laser light L1 on the phase modulation plane 10a of the spatial light modulation section 10, onto the light incident plane 20a of the wavelength conversion section 20.

Figure 7:
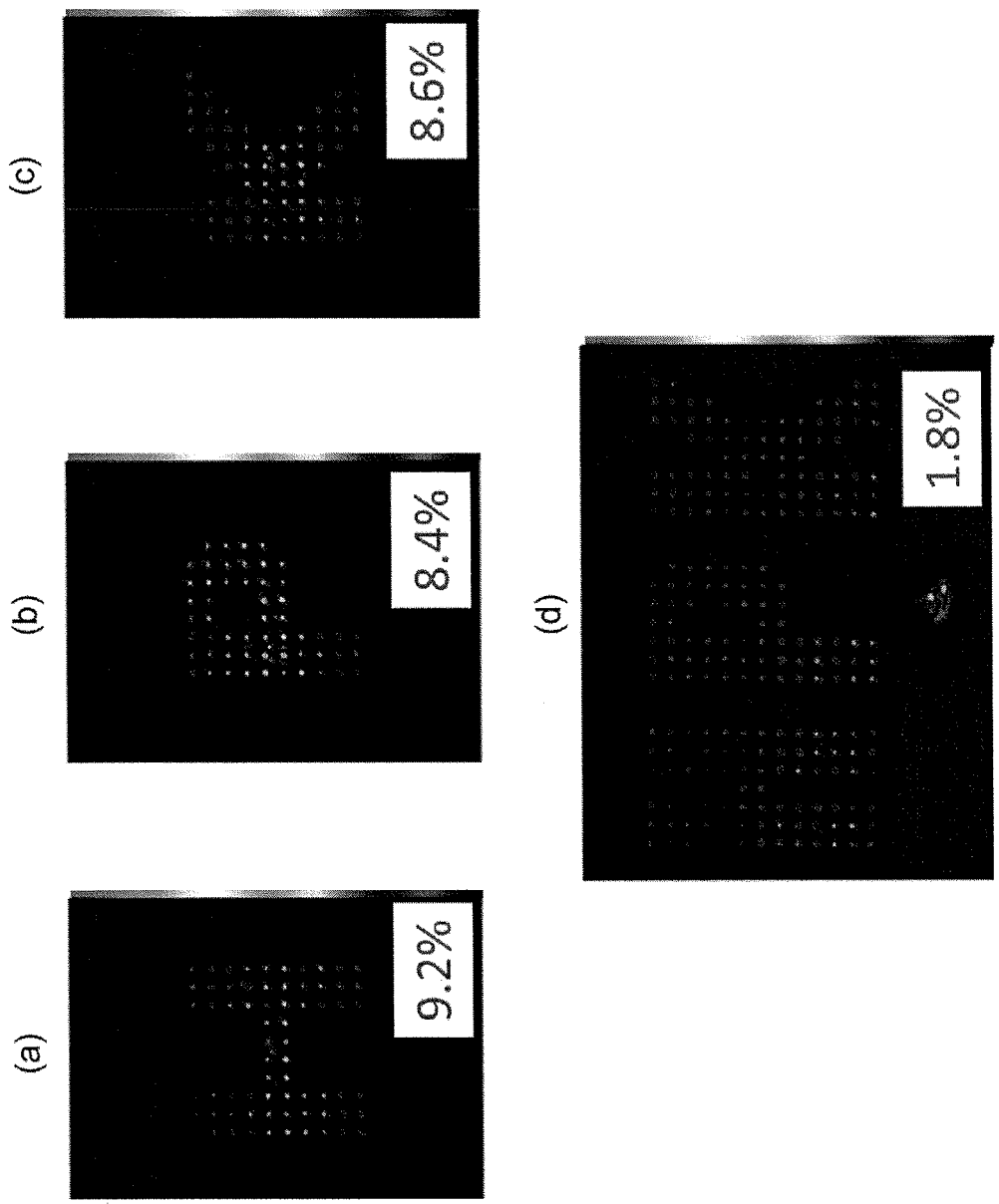
FIG. 7 includes (a)-(d) diagrams showing the results of generating character patterns by use of the light modulation device according to the present embodiment as examples.

Here, FIG. 7 includes diagrams showing the results of generating character patterns by use of the light modulation device 1B according to the present embodiment as examples. In this example, character patterns "H," "P," "K," and "HPK" were generated, and further, an intensity distribution of a generated pattern of the ultraviolet laser light L3 (wavelength of 258 nm) was observed by use of a beam profiler installed on the imaging plane 46 (refer to FIG. 3). Moreover, wavelength conversion efficiencies from the laser light L1 (wavelength of 515 nm) to the ultraviolet laser light L3 (wavelength of 258 nm) were measured.

As a result, the wavelength conversion efficiency in a state in which phase modulation is not performed was 12.8%. In contrast thereto, the wavelength conversion efficiency when the character pattern "H" is generated by phase modulation is 9.2%, the wavelength conversion efficiency when the character pattern "P" is generated is 8.4%, and the wavelength conversion efficiency when the character pattern "K" is generated is 8.6%. As these described above, it is confirmed that, with respect to a character pattern composed of one character, it is possible to generate a pattern without greatly reducing the wavelength conversion efficiency.

In addition, the wavelength conversion efficiency when the character pattern "HPK" is generated is 1.8%. A phase modulation amount to be provided by the SLM is increased according to the complexity of a generated pattern. In the character pattern "HPK" composed of three characters, high angle scattering components of light are increased due to modulation with fine spatial pitches. Thereby, at the time of transferring the modulated laser light L2 in the image transfer optical system 30, the ratio of components with larger incident angles to the nonlinear optical crystal of the wavelength conversion section 20 is increased.

That is, because components over an incident angle allowed in wavelength conversion are increased, which causes these components not to contribute to the wavelength conversion, it is considered that the wavelength conversion efficiency may be reduced. In this way, when a generated pattern is complicated, the wavelength conversion efficiency may be reduced due to restrictions by an allowable angle of the nonlinear optical crystal in some cases. In order to solve this problem, for example, it is preferable to simultaneously use a control program of restricting phase modulation by which it is expected that the wavelength conversion efficiency is reduced to a given value or less. Further, for example, by adjusting an angle of the nonlinear optical crystal so as to maximize the wavelength conversion efficiency in a state in which predetermined phase modulation is performed, it is possible to lower the decrease in efficiency.

Figure 8:
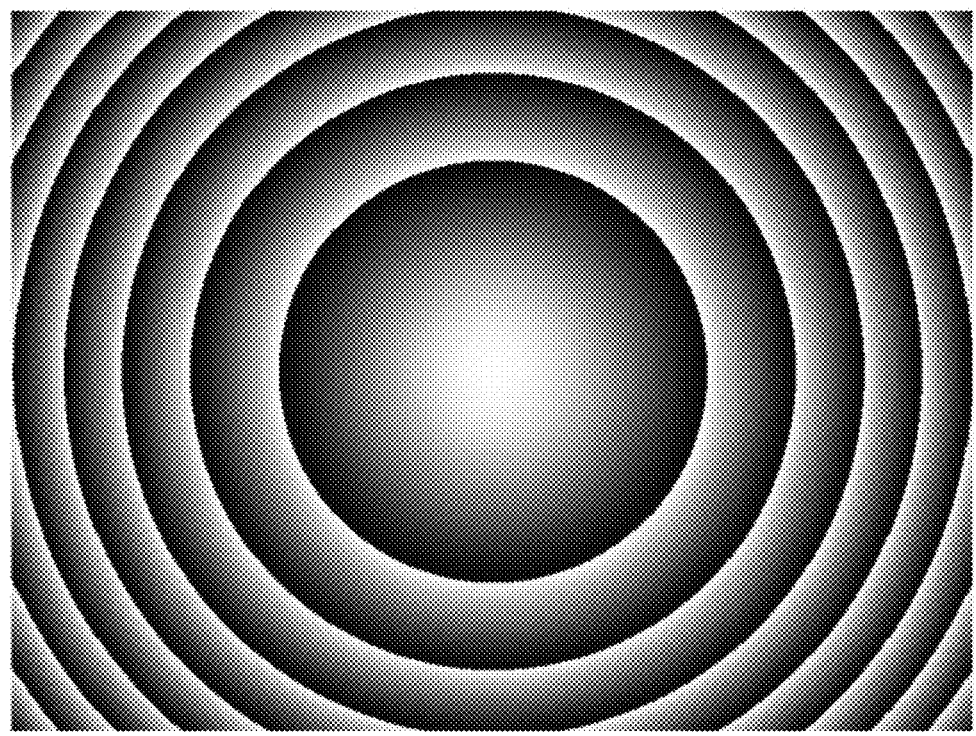
FIG. 8 is a diagram showing an example of a Fresnel lens phase pattern.
Figure 9:
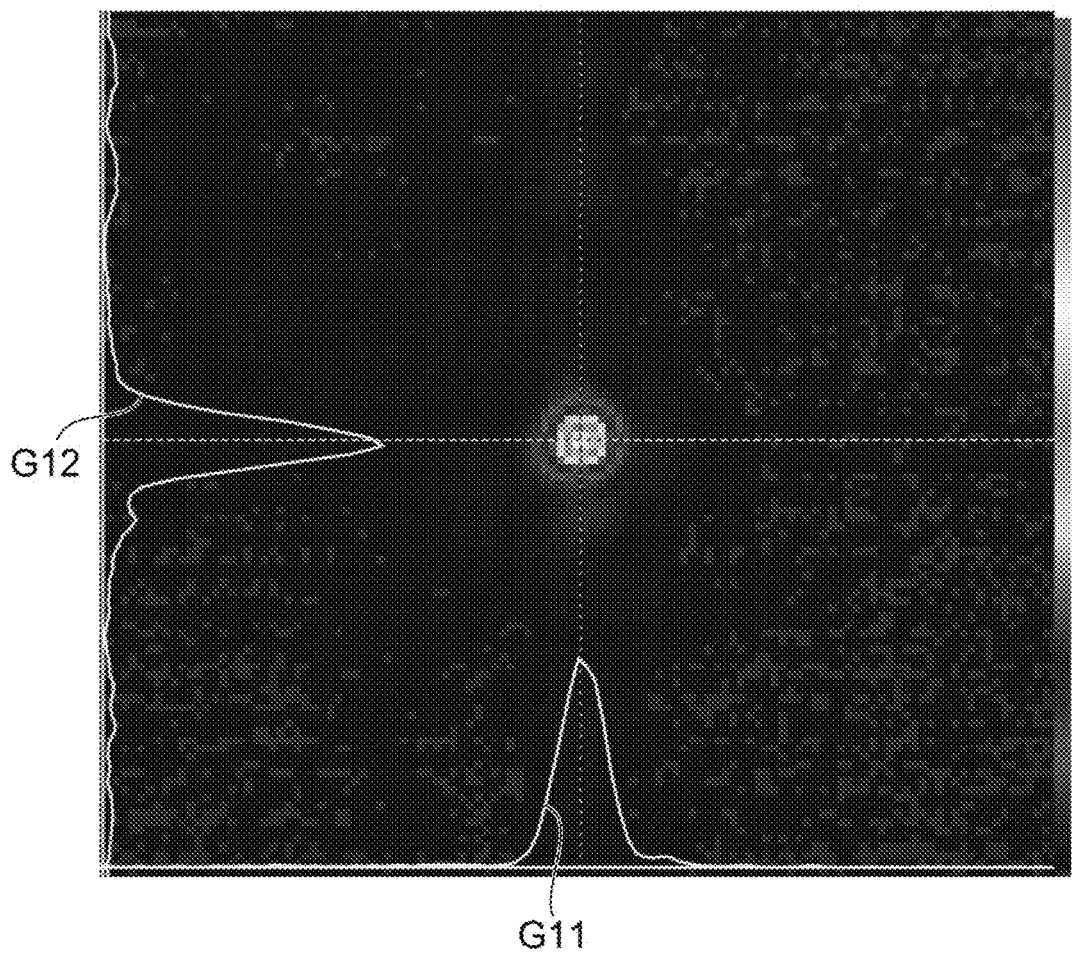
FIG. 9 is a diagram showing a spot observation image in the case where phase modulation is performed by use of a phase pattern of a Fresnel lens whose focal length is 12 m.

Further, in the present embodiment, by performing Fresnel lens phase modulation, it is possible to shift a light condensing position (imaging position) of the ultraviolet laser L3 by an arbitrary distance in an optical axis direction. Such controlling of an imaging position is a function which is desired, for example, at the time of performing three-dimensional multispot simultaneous processing. FIG. 8 is a diagram showing an example of a Fresnel lens phase pattern. Further, FIG. 9 is a diagram showing a spot observation image in the case where phase modulation is performed by use of a phase pattern of a Fresnel lens whose focal length is 12 m. In addition, in FIG. 9, a graph G11 shows a light intensity distribution in the horizontal axis direction, and a graph G12 shows a light intensity distribution in the vertical axis direction. Further, this spot observation image is an observation image by a beam profiler installed at a position moved by 22 mm from the imaging position when phase modulation is not performed to the condensing lens side. As shown in FIG. 9, it is confirmed that the imaging position is changed in the optical axis direction by performing phase modulation by use of the Fresnel lens phase pattern.

Figure 10:
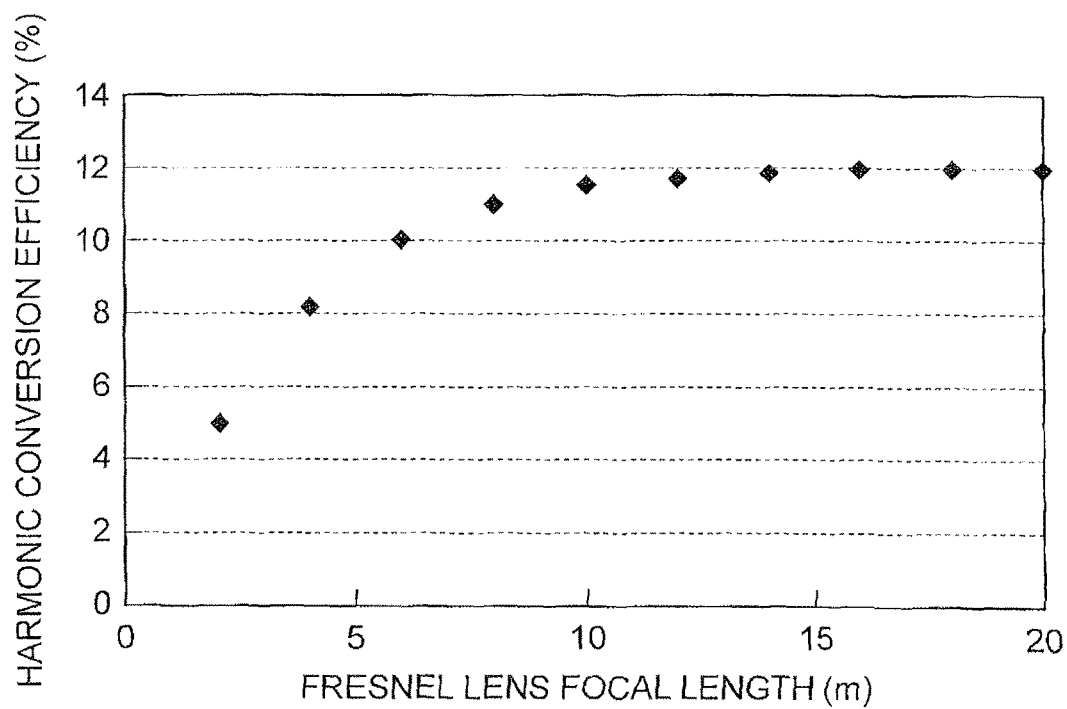
FIG. 10 is a graph on which the relationship between wavelength conversion efficiencies from modulated laser light (wavelength of 515 nm) to ultraviolet laser light (wavelength of 258 nm) in a BBO crystal, and focal lengths of a Fresnel lens phase pattern is plotted.

FIG. 10 is a graph on which the relationship between wavelength conversion efficiencies from the modulated laser light L2 (wavelength of 515 nm) to the ultraviolet laser light L3 (wavelength of 258 nm) in a BBO crystal, and focal lengths of a Fresnel lens phase pattern is plotted. In FIG. 10, the horizontal axis shows focal lengths (unit: meters), and the vertical axis shows wavelength conversion efficiencies (unit: %). As shown in FIG. 10, it is understood that sufficient wavelength conversion efficiencies are obtained in the case where focal lengths are 10 m or more. Accordingly, in the present configuration, in the case where a Fresnel lens phase pattern is used, a focal length is preferably 10 m or more. However, it is a matter of course that this preferable focal length range changes according to a structured optical system.

Figure 11:
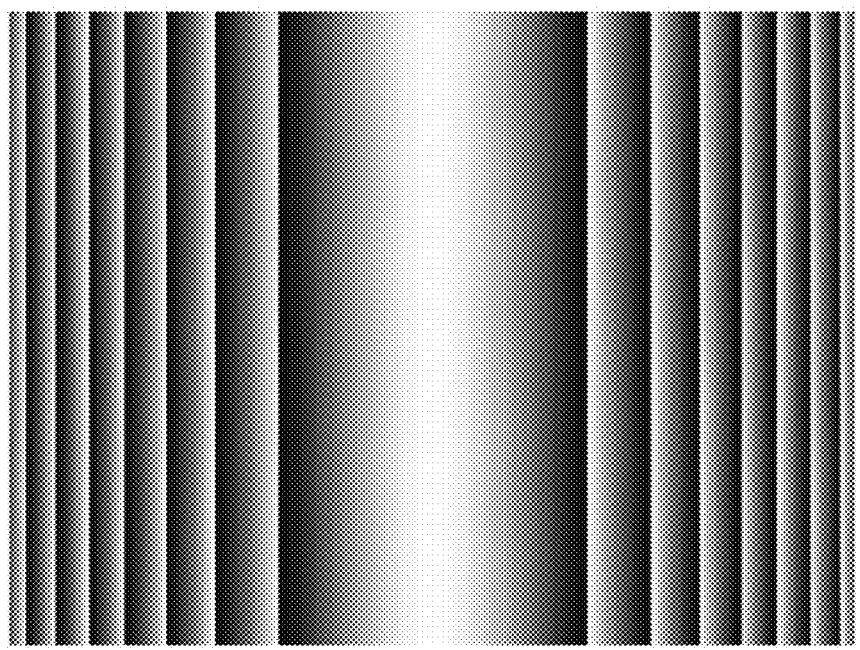
FIG. 11 includes (a), (b) diagrams showing examples of cylindrical lens phase patterns.
Figure 11:
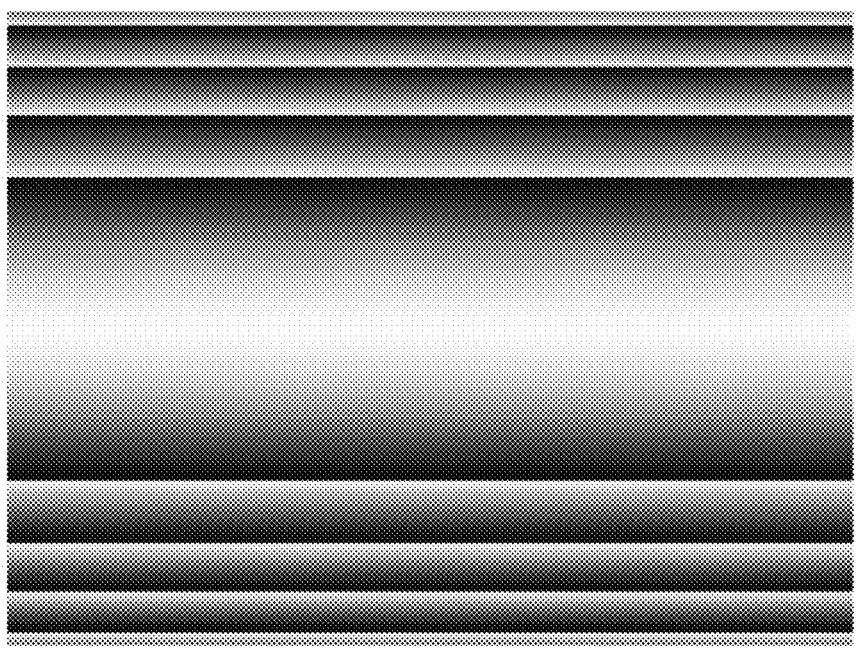
Figure 12:
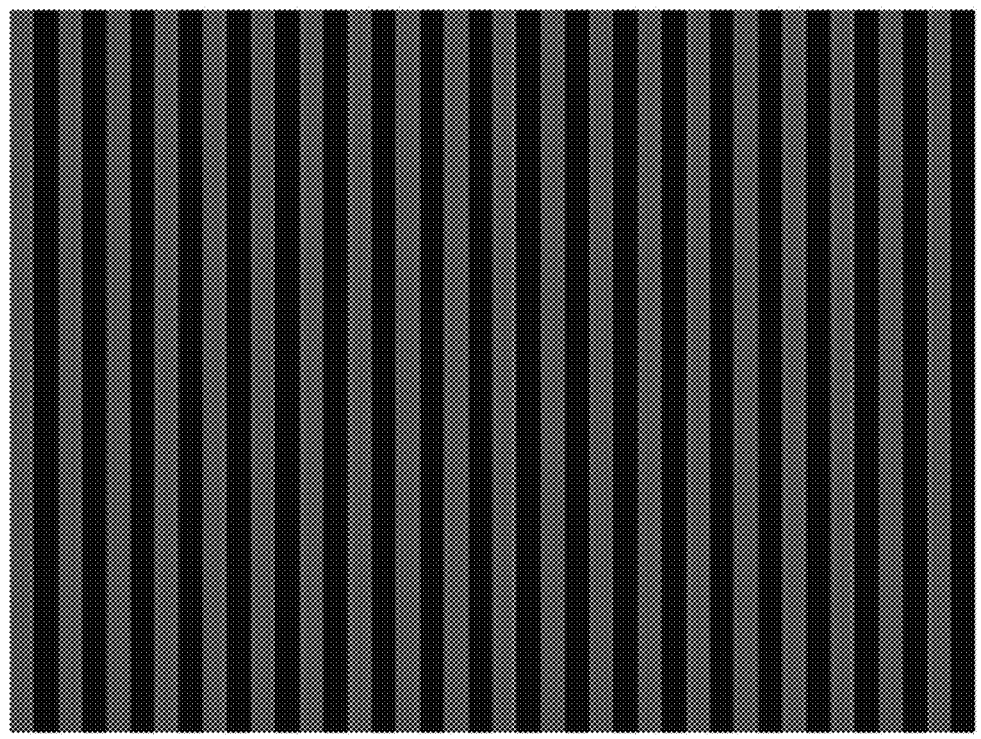
FIG. 12 is a diagram showing an example of a one-dimensional diffraction grating phase pattern.

In addition, in harmonic conversion in a nonlinear optical crystal, an axis direction with a large allowable angle and an axis direction with a small allowable angle exist in a plane perpendicular to the optical axis. Accordingly, by performing phase modulation only in the axis direction with a large allowable angle, it is possible to apply large phase modulation without reducing the wavelength conversion efficiency. As an example of a phase pattern with which phase modulation is performed only in one axis direction, there are a cylindrical lens and a one-dimensional diffraction grating. (a) in FIG. 11 and (b) in FIG. 11 are diagrams showing examples of cylindrical lens phase patterns. Further, FIG. 12 is a diagram showing an example of a one-dimensional diffraction grating phase pattern.

When a cylindrical lens phase pattern is used, a shape of a cross-section perpendicular to the optical axis direction of the ultraviolet laser light L3 becomes linear so as to be extended in one axis direction. Accordingly, it is possible to effectively perform overall processing onto a large area processing object surface. Further, when a one-dimensional diffraction grating phase pattern is used, because it is possible to split the optical axis of the ultraviolet laser light L3 into a plurality of optical axes, this is favorable for use in multispot simultaneous processing or the like. In this way, even in the case where phase modulation only in one axis direction is performed, it is possible to generate the ultraviolet laser light L3 effective for use in various types of processing.

Figure 13:
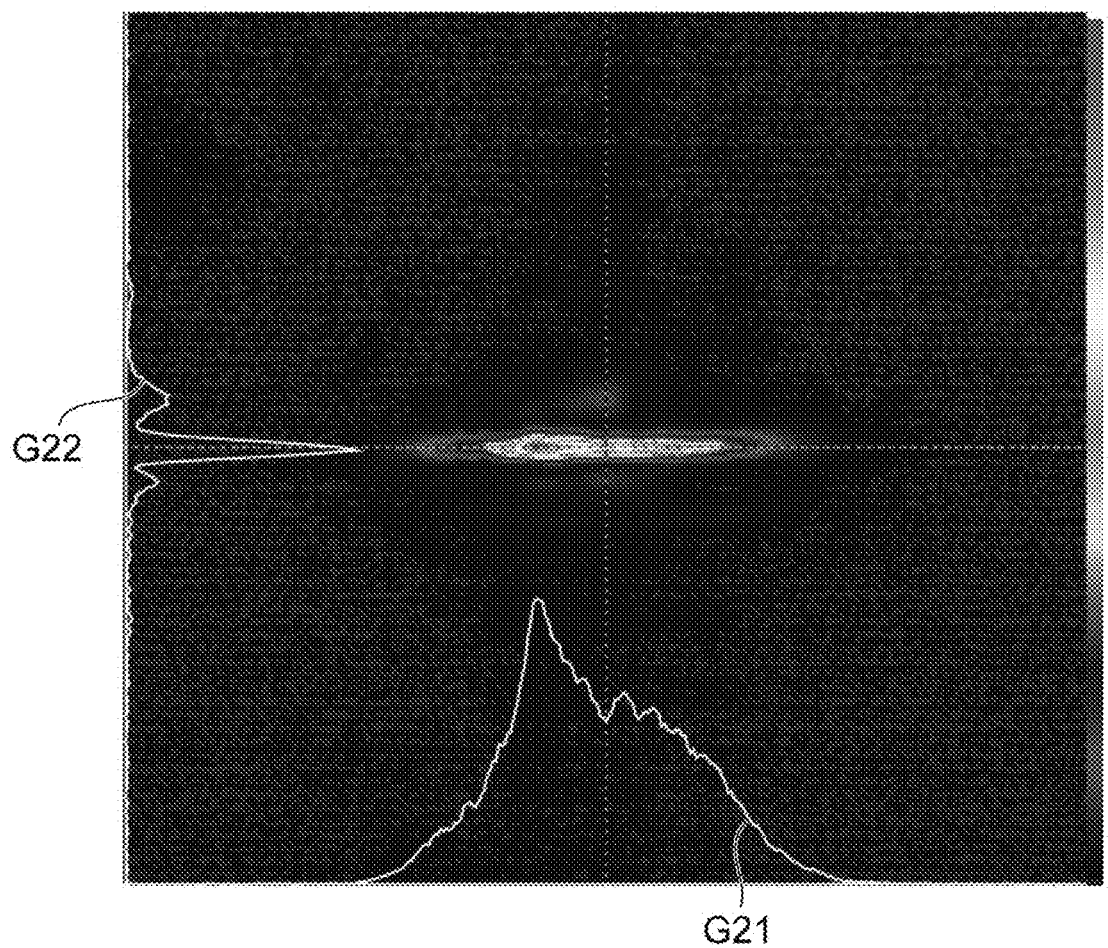
FIG. 13 is a diagram showing an observation image in the case where phase modulation is performed by use of a phase pattern of a cylindrical lens whose focal length is 8 m.

FIG. 13 is a diagram showing an observation image in the case where phase modulation is performed by use of a phase pattern of a cylindrical lens whose focal length is 8 m. In addition, in FIG. 13, a graph G21 shows a light intensity distribution in the horizontal axis direction, and a graph G22 shows a light intensity distribution in the vertical axis direction. Further, this observation image is an observation image by a beam profiler installed at a position at which a beam diameter becomes 50 μm when phase modulation is not performed. As shown in FIG. 13, it is confirmed that it is possible to favorably form the ultraviolet laser light L3 having a linear cross-sectional shape by performing phase modulation by use of the cylindrical lens phase pattern. In addition, when the cylindrical lens phase pattern having a curvature in a direction corresponding to the horizontal direction in FIG. 13 is further written on the reflection type SLM 14, in contrast to the fact that the beam width of the observed profile in the vertical direction remaining 50 μm, the beam width in the horizontal direction was extended to 600 μm.

Figure 14:
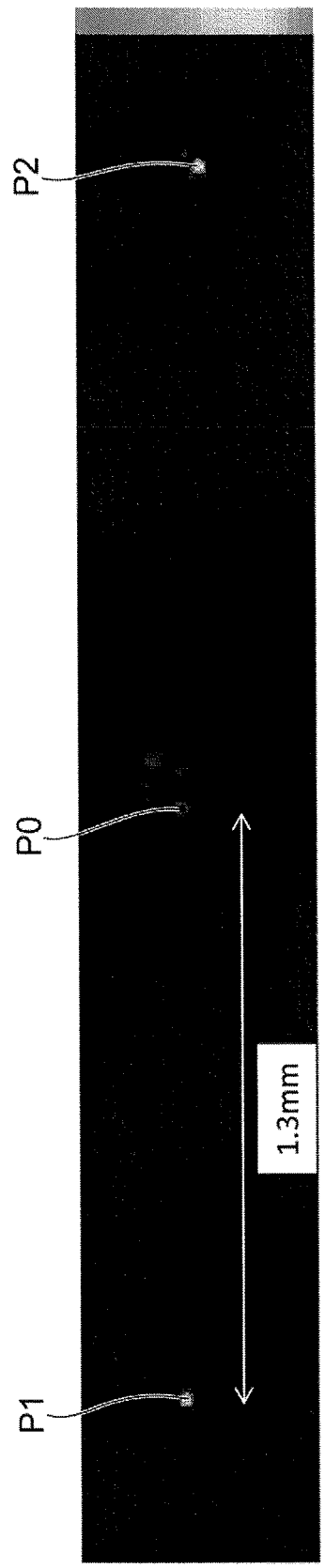
FIG. 14 is a diagram showing an observation image in the case where phase modulation is performed by use of a phase pattern of a two-value diffraction grating with a grating space of 200 μm.

FIG. 14 is a diagram showing an observation image in the case where phase modulation is performed by use of a phase pattern of a two-value diffraction grating with a grating space of 200 μm. This observation image is an image observed by a beam profiler installed on the imaging plane 46 shown in FIG. 3. As shown in FIG. 14, two spots P1 and P2 corresponding to first-order diffracted light due to diffraction appeared. These spots P1 and P2 were observed at positions shifted about 1.3 mm in the horizontal direction from a zeroth-order position P0.

(Modification)

Figure 15:
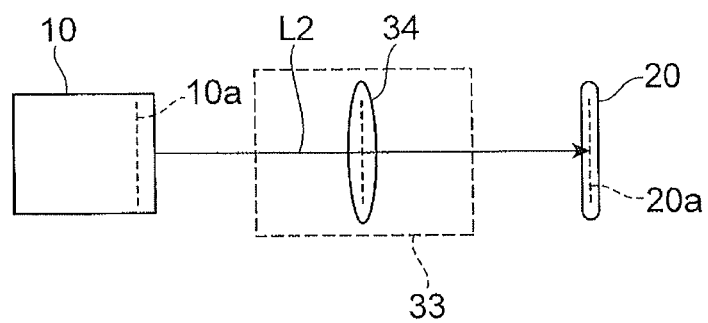
FIG. 15 is a diagram showing a configuration of an image transfer optical system 33 as a modification of an image transfer optical system in the above-described embodiment.

FIG. 15 is a diagram showing a configuration of an image transfer optical system 33 as a modification of the image transfer optical system 30 in the above-described embodiment. This image transfer optical system 33 includes a single lens 34, and the phase modulation plane 10a of the spatial light modulation section 10 and the light incident plane (the wavelength conversion plane) 20a of the wavelength conversion section 20 are coupled so as to be optically conjugate systems to each other by this single lens 34. Specifically, a focal length f of the lens 34, a distance f1 between the phase modulation plane 10a and the lens 34, and a distance f2 between the lens 34 and the wavelength conversion plane 20a are set so as to satisfy the following relational expression (1).

[Formula 1]

$$\frac{1}{f1} + \frac{1}{f2} = \frac{1}{f} \quad (1)$$

The light modulation device 1B may include the image transfer optical system 33 shown in FIG. 15 in place of the image transfer optical system 30 shown in FIG. 3. Even in this case, it is possible to favorably obtain the effects of the above-described embodiment.

Second Embodiment

Figure 16:
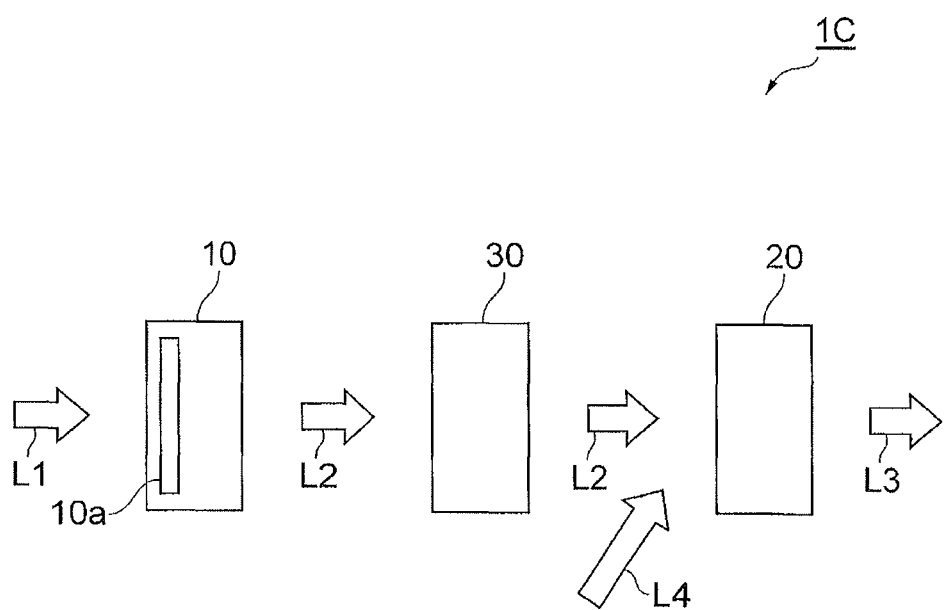
FIG. 16 is a diagram schematically showing a configuration of a light modulation device according to a second embodiment.

FIG. 16 is a diagram schematically showing a configuration of a light modulation device according to a second embodiment of the present invention. A light modulation device 1C according to the present embodiment includes the spatial light modulation section 10, the wavelength conversion section 20, and the image transfer optical system 30 in the same way as the light modulation device 1A according to the first embodiment. The light modulation device 1C is different from the light modulation device 1A in the point that the nonlinear optical crystal composing the wavelength conversion section 20 receives a light beam L4 other than the modulated laser light L2 output from the spatial light modulation section 10 along with the modulated laser light L2 on the light incident plane, and generates a sum frequency or a difference frequency of the modulated laser light L2 and the light beam L4, thereby generating the ultraviolet laser light L3. With this configuration, it is possible to increase the number of wavelengths available after conversion, and effectively avoid a decrease in wavelength conversion efficiency.

The light beam L4 is preferably light which is partially split from the laser light L1 before being input to the spatial light modulation section 10. Thereby, it is possible to perfectly synchronize the modulated laser light 12 and the light beam L4, so as to favorably generate ultra-short pulsed ultraviolet laser light L3. In addition, the light beam L4 may be light in the process of conversion in the spatial light modulation section 10. Further, the laser light L1 before being input to the spatial light modulation section 10 may be utilized after being converted into a favorable state as the light beam L4.

Figure 17:
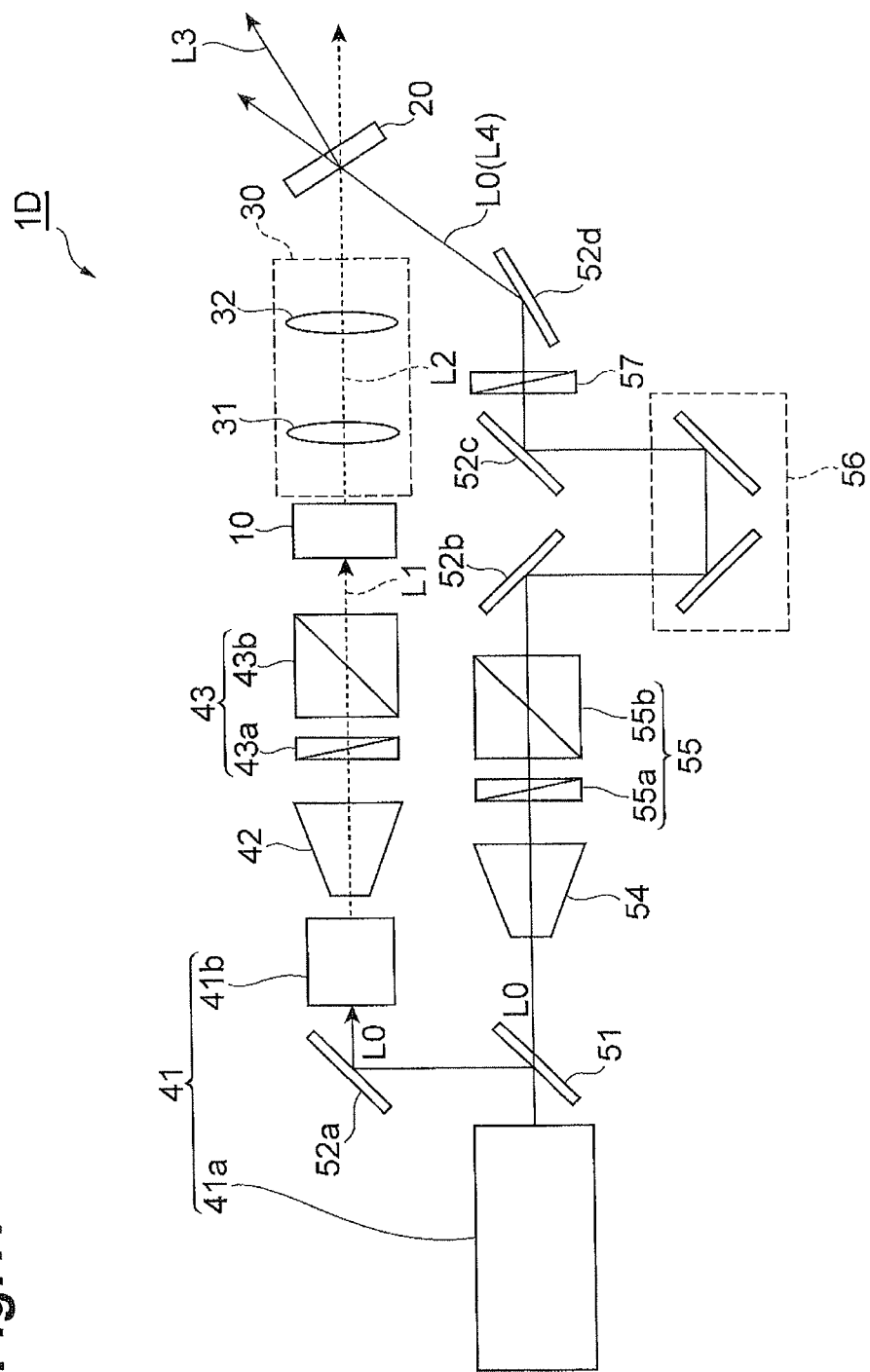
FIG. 17 is a diagram showing a light modulation device as a specific example of the above-described light modulation device.

FIG. 17 is a diagram showing a light modulation device 1D as a specific example of the above-described light modulation device 1C. The light modulation device 1D shown in FIG. 17 includes, in addition to the spatial light modulation section 10, the wavelength conversion section 20, the image transfer optical system 30, the light source 41, the beam expander 42, and the attenuator 43 shown in FIG. 2, a beam splitter 51, reflecting mirrors 52a to 52d, a beam expander 54, an attenuator 55 (a wave plate 55a and a polarization beam splitter 55b), a variable optical delay system 56, and a λ/2 plate 57.

The beam splitter 51 is disposed between the ultra-short pulsed laser light source 41a of the light source 41 and the SHG conversion unit 41b, and partially splits laser light L0 output from the ultra-short pulsed laser light source 41a. In addition, a wavelength of the laser light L0 is, for example, 1030 nm. The laser light L0 split by the beam splitter 51 is adjusted to have the optimum beam profile and light intensity by the beam expander 54 and the attenuator 55, and passes through the variable optical delay system 56, to be thereafter adjusted to be an appropriate polarization by the λ/2 plate 57, and is incident, as the light beam L4, into the nonlinear optical crystal of the wavelength conversion section 20 via the reflecting mirror 52d. In the nonlinear optical crystal, for example, the ultraviolet laser light L3 with a wavelength of 343 nm utilizing non-coaxial sum frequency generation is generated.

Here, in order to favorably perform wavelength conversion in the wavelength conversion section 20, it is necessary to equalize the optical path lengths between the both optical paths to the extent at which the light pulse composing the modulated laser light L2 and the light pulse composing the light beam L4 are sufficiently overlapped on the nonlinear optical crystal of the wavelength conversion section 20. In the present embodiment, because the ultra-short pulse is used, it is necessary to precisely perform adjustment for equalizing the optical path lengths, and for this, the variable optical delay system 56 is utilized. In addition, because the variable optical delay system 56 is favorably inserted into an optical path with a shorter optical path length in a state in which the variable optical delay system 56 is not provided, a configuration in which the variable optical delay system may be inserted into an optical path of the laser light L1 or the modulated laser light L2 as well is possible.

Because FIG. 17 shows an example of the light modulation device 1C described above, it is a matter of course that any other configurations as well are possible. For example, a configuration in which the laser light L1 is light with a wavelength of 1030 mu and the light beam L4 is light with a wavelength of 515 nm as well is possible. Further, in the configuration in which the laser light L1 is light with a wavelength of 515 nm, in the case where the laser light L1 with a wavelength of 515 nm is partially utilized as the light beam L4, the ultraviolet laser light L3 with a wavelength of 258 nm is generated by sum frequency generation.

In accordance with the light modulation devices 1C and 1D according to the present embodiment, it is possible to exert the same effects as those of the light modulation devices 1A and 1B according to the first embodiment described above. Further, in accordance with the present embodiment, it is possible to increase one of the allowable angles of the ultraviolet laser light L3 and the light beam L4 which are incident into the nonlinear optical crystal.

The wavelength conversion type spatial light modulation device according to the present invention is not limited to the above-described embodiments, and other various modifications are possible. For example, the LCOS type one has been exemplified as the spatial light modulation section in the above-described embodiments, meanwhile, the spatial light modulation section of the present invention is not limited thereto. For example, a segment type MEMS (Micro Electro Mechanical Systems) mirror which is capable of changing its surface shape for each of a plurality of pixel regions may be used as the spatial light modulation section. In a MEMS mirror, the surface shape formed by irregularity of the respective segments serves as a phase pattern for modulating the wave front of laser light. Further, a deformable mirror may be used as the spatial light modulation section. In a deformable mirror, its surface shape serves as a phase pattern. In both cases, there is the feature that it is possible to obtain modulated light with a wavelength shorter than a wavelength region which is able to be modulated by use of a single spatial light modulation section.

The wavelength conversion type spatial light modulation device according to the above-described embodiment includes a spatial light modulation section having a phase modulation plane to which laser light in a wavelength region longer than an ultraviolet region is input, and on which a phase of the laser light is modulated at each of a plurality of two-dimensionally arrayed regions, to generate modulated laser light, a wavelength conversion section having a light incident plane which receives the modulated laser light output from the spatial light modulation section, and converting a wavelength of the modulated laser light into a wavelength in the ultraviolet region, and an image transfer optical system which couples the phase modulation plane of the spatial light modulation section and the light incident plane of the wavelength conversion section, so as to be optically conjugate systems to each other.

Further, the wavelength conversion type spatial light modulation device may be configured such that the spatial light modulation section has a liquid crystal layer modulating a phase of the laser light according to a level of an applied electric field, alignment films being disposed on the both sides of the liquid crystal layer, and a plurality of electrodes being provided respectively for the plurality of regions, and applying a voltage for generating the applied electric field to the liquid crystal layer. When ultraviolet laser light transmits through the liquid crystal layer and the alignment films of the spatial light modulation section, the liquid crystal layer and the alignment films are gradually deteriorated. In accordance with the above-described wavelength conversion type spatial light modulation device, because laser light in a wavelength region longer than an ultraviolet region is input to the spatial light modulation section, it is possible to favorably output ultraviolet laser light which is spatially phase-modulated while reducing influence on the liquid crystal layer and the alignment films.

Further, the wavelength conversion type spatial light modulation device may be configured such that the wavelength conversion section includes a nonlinear optical crystal. Thereby, it is possible to favorably convert a wavelength of the modulated laser light in a wavelength region longer than the ultraviolet region into a wavelength in the ultraviolet region. In this case, the nonlinear optical crystal may convert a wavelength of the laser light into a wavelength in the ultraviolet region by generating a harmonic of the modulated laser light. Or, the wavelength conversion section may receive a light beam other than the modulated laser light output from the spatial light modulation section along with the modulated laser light on the light incident plane, and may convert a wavelength of the modulated laser light into a wavelength in the ultraviolet region by use of the modulated laser light and the other light beam. In this case, the wavelength conversion section may include a nonlinear optical crystal, and convert a wavelength of the modulated laser light into a wavelength in the ultraviolet region by generating a sum frequency or a difference frequency of the modulated laser light and the light beam. In addition, the above-described other light beam is preferably light split from the laser light before being input to the spatial light modulation section.

Further, the wavelength conversion type spatial light modulation device may be configured such that the image transfer optical system includes a 4f optical system. Thereby, it is possible to favorably transfer a phase distribution provided to the laser light on the phase modulation plane of the spatial light modulation section, onto the light incident plane of the wavelength conversion section.

INDUSTRIAL APPLICABILITY

The present invention is applicable as a wavelength conversion type spatial light modulation device which is capable of outputting ultraviolet laser light which is spatially phase-modulated, and reduces influence onto its spatial light modulation section.

REFERENCE SIGNS LIST 1A, 1B, 1C, 1D—light modulation device, 10—spatial light modulation section, 10a—phase modulation plane, 11—SLM module, 12—housing, 13—prism, 14—reflection type SLM, 20—wavelength conversion section, 20a—light incident plane (wavelength conversion plane), 30—image transfer optical system, 31, 32—lens, 33—image transfer optical system, 34—lens, 41—light source, 41a—ultra-short pulsed laser light source, 41b—conversion unit, 42—beam expander, 43—attenuator, 44—condensing lens, 45—processing stage, 46—imaging plane, 51—beam splitter, 54—beam expander, 55—attenuator, 56—variable optical delay system, 57—λ/2 plate, A—processing object, L1—laser light, L2—modulated laser light, L3—ultraviolet laser light.

The invention claimed is:
1. A wavelength conversion type spatial light modulation device comprising:
a spatial light modulation section having a phase modulation plane to which laser light in a wavelength region longer than an ultraviolet region is input, and on which a phase of the laser light is modulated at each of a plurality of two-dimensionally arrayed regions, to generate modulated laser light;
a wavelength conversion section having a light incident plane which receives the modulated laser light output from the spatial light modulation section, and converting a wavelength of the modulated laser light into a wavelength in the ultraviolet region; and
an image transfer optical system coupling the phase modulation plane of the spatial light modulation section and the light incident plane of the wavelength conversion section, so as to be optically conjugate systems to each other, wherein
the spatial light modulation section includes a spatial light modulator,
the image transfer optical system transfers a phase distribution of the modulated laser light provided on the phase modulation plane of the spatial light modulator, onto the light incident plane of the wavelength conversion section, so as to perform wavelength conversion in a state in which the phase distribution is provided to the modulated laser light, and
the image transfer optical system includes a 4f optical system.
2. The wavelength conversion type spatial light modulation device according to claim 1, wherein the spatial light modulator of the spatial light modulation section has
a liquid crystal layer modulating a phase of the laser light according to a level of an applied electric field,
alignment films being disposed on the both sides of the liquid crystal layer, and
a plurality of electrodes being provided respectively for the plurality of regions, and applying a voltage for generating the applied electric field to the liquid crystal layer.
3. The wavelength conversion type spatial light modulation device according to claim 1, wherein the wavelength conversion section includes a nonlinear optical crystal.
4. The wavelength conversion type spatial light modulation device according to claim 3, wherein the nonlinear optical crystal converts a wavelength of the modulated laser light into a wavelength in the ultraviolet region by generating a harmonic of the modulated laser light.
5. The wavelength conversion type spatial light modulation device according to claim 1, wherein the wavelength conversion section receives a light beam other than the modulated laser light output from the spatial light modulation section along with the modulated laser light on the light incident plane, and converts a wavelength of the modulated laser light into a wavelength in the ultraviolet region by use of the modulated laser light and the light beam.
6. The wavelength conversion type spatial light modulation device according to claim 5, wherein the wavelength conversion section includes a nonlinear optical crystal, and converts a wavelength of the modulated laser light into a wavelength in the ultraviolet region by generating a sum frequency or a difference frequency of the modulated laser light and the light beam.
7. The wavelength conversion type spatial light modulation device according to claim 5, wherein the light beam is light split from the laser light before being input to the spatial light modulation section.
8. A wavelength conversion type spatial light modulation device comprising:

a spatial light modulation section having a phase modulation plane to which laser light in a wavelength region longer than an ultraviolet region is input, and on which a phase of the laser light is modulated at each of a plurality of two-dimensionally arrayed regions, to generate modulated laser light;

a wavelength conversion section having a light incident plane which receives the modulated laser light output from the spatial light modulation section, and converting a wavelength of the modulated laser light into a wavelength in the ultraviolet region; and an image transfer optical system coupling the phase modulation plane of the spatial light modulation section and the light incident plane of the wavelength conversion section, so as to be optically conjugate systems to each other, wherein the spatial light modulation section includes a spatial light modulator, the image transfer optical system transfers a phase distribution of the modulated laser light provided on the phase modulation plane of the spatial light modulator, onto the light incident plane of the wavelength conversion section, so as to perform wavelength conversion in a state in which the phase distribution is provided to the modulated laser light, the wavelength conversion section receives a light beam other than the modulated laser light output from the spatial light modulation section along with the modulated laser light on the light incident plane, and converts a wavelength of the modulated laser light into a wavelength in the ultraviolet region by use of the modulated laser light and the light beam, and the wavelength conversion section includes a nonlinear optical crystal, and converts a wavelength of the modulated laser light into a wavelength in the ultraviolet region by generating a sum frequency or a difference frequency of the modulated laser light and the light beam.

9. The wavelength conversion type spatial light modulation device according to claim 8, wherein the light beam is light split from the laser light before being input to the spatial light modulation section.

10. The wavelength conversion type spatial light modulation device according to claim 8, wherein the spatial light modulator of the spatial light modulation section has a liquid crystal layer modulating a phase of the laser light according to a level of an applied electric field, alignment films being disposed on the both sides of the liquid crystal layer, and a plurality of electrodes being provided respectively for the plurality of regions, and applying a voltage for generating the applied electric field to the liquid crystal layer.

* * * * *